(12) United States Patent
Wende et al.

(10) Patent No.: US 9,391,608 B2
(45) Date of Patent: Jul. 12, 2016

(54) PIECE OF FURNITURE WITH AN ELECTRONIC SWITCHING ELEMENT FOR AN AIRLINER

(71) Applicant: LUFTHANSA TECHNIK AG, Hamburg (DE)

(72) Inventors: Gerko Wende, Hamburg (DE); Andrew Muirhead, Norderstedt (DE)

(73) Assignee: LUFTHANSA TECHNIK AG, Hamburg (DE)

( * ) Notice: Subject to any disclaimer, the term of this patent is extended or adjusted under 35 U.S.C. 154(b) by 0 days.

(21) Appl. No.: 13/261,869

(22) PCT Filed: Nov. 13, 2012

(86) PCT No.: PCT/EP2012/004716
§ 371 (c)(1),
(2) Date: May 14, 2014

(87) PCT Pub. No.: WO2013/072040
PCT Pub. Date: May 23, 2013

(65) Prior Publication Data
US 2014/0246300 A1  Sep. 4, 2014

(30) Foreign Application Priority Data
Nov. 14, 2011 (DE) .......... 10 2011 086 320

(51) Int. Cl.
*H03K 17/975* (2006.01)
*H03K 17/96* (2006.01)
(Continued)

(52) U.S. Cl.
CPC .............. *H03K 17/962* (2013.01); *B64D 11/00* (2013.01); *H01H 9/04* (2013.01); *H03K 2217/96079* (2013.01); *H03K 2217/960755* (2013.01)

(58) Field of Classification Search
CPC .......... H01H 2300/08; H01H 2300/01; H01H 2239/074; H01H 2239/024; H01H 2239/006; H01H 2233/03; H01H 2233/00; H01H 2231/052; H01H 2231/036; H01H 2231/026; H01H 2231/032; H01H 2231/016; H01H 2233/034; H01H 2223/01; H01H 2223/034; H01H 2223/00; H01H 2221/09; H01H 2221/04; H01H 2221/002; H01H 2217/016; H01H 2207/026; H01H 3/12; H01H 1/00; H01H 9/04; H01H 9/00; H01H 9/02; H01H 9/0271; H01H 9/041; H01H 9/16; H01H 9/161; H01H 9/18; H01H 9/182; H01H 9/0235; H01H 2300/00; H01H 2231/36; H01H 3/00; H01H 5/00; H01H 13/02; H01H 13/04; H01H 13/06; H01H 13/14; H01H 13/10; H01H 13/26; H01H 13/50; H01H 13/503; H01H 13/52; H01H 2003/12; H01H 2201/01; H01H 2209/00; H01H 2209/004; H01H 2209/016; H01H 2209/018; H01H 2209/022; H01H 2215/00; H01H 2215/004; H01H 2215/006; H03K 17/96; H03K 17/962; H03K 17/97; B64D 11/00; G01R 27/26
USPC .......................................................... 200/600
See application file for complete search history.

(56) References Cited

U.S. PATENT DOCUMENTS 4,439,646 A * 3/1984 Bouvrande .................. 200/5 A
7,244,898 B2 * 7/2007 Kim ...................... H01H 13/83
                                              200/314

(Continued)

FOREIGN PATENT DOCUMENTS

DE       103 07 473        9/2004
DE    10 2004 005 952      8/2005

(Continued)

*Primary Examiner* — Renee Luebke
*Assistant Examiner* — Anthony R. Jimenez
(74) *Attorney, Agent, or Firm* — Saliwanchik, Lloyd & Eisenschenk

(57) ABSTRACT

Piece of furniture comprising an electronic switching element for controlling a cabin function for an airliner, wherein the piece of furniture has a structural layer with a cover layer arranged above the structural layer, wherein the electronic switching element is configured as a capacitive switching element and is arranged underneath the cover layer inside and/or underneath the structural layer.

22 Claims, 3 Drawing Sheets

(51) Int. Cl.
*B64D 11/00* (2006.01)
*H01H 9/04* (2006.01)

(56) References Cited

U.S. PATENT DOCUMENTS

| | | | |
|---|---|---|---|
| 7,525,056 B2 * | 4/2009 | Chiba et al. | 200/314 |
| 7,652,230 B2 | 1/2010 | Baier | |
| 8,042,868 B2 * | 10/2011 | Sakai et al. | 297/217.3 |
| 2007/0095643 A1 | 5/2007 | Weiss et al. | |
| 2009/0058118 A1 * | 3/2009 | Hein et al. | 296/1.08 |
| 2009/0090611 A1 | 4/2009 | Zeijlon et al. | |
| 2010/0309030 A1 * | 12/2010 | Huang | H01H 13/702 341/33 |
| 2013/0002605 A1 | 1/2013 | Leuchtenberg et al. | |

FOREIGN PATENT DOCUMENTS

| | | |
|---|---|---|
| DE | 10 2008 018 616 | 10/2009 |
| DE | 10 2008 043 126 | 7/2010 |
| DE | 10 2009 001 412 | 9/2010 |
| DE | 10 2009 037 797 | 2/2011 |
| DE | 10 2010 010 806 | 9/2011 |
| EP | 2 048 781 | 4/2009 |
| EP | 2 062 817 | 5/2009 |
| EP | 2 273 678 | 1/2011 |
| EP | 2 337 225 | 6/2011 |
| EP | 2 385 630 | 11/2011 |
| WO | WO-2005/101663 | 10/2005 |
| WO | WO-2007/124754 | 11/2007 |

* cited by examiner

PIECE OF FURNITURE WITH AN ELECTRONIC SWITCHING ELEMENT FOR AN AIRLINER

CROSS-REFERENCE TO RELATED APPLICATIONS

The present application is the U.S. National Stage Application of International Patent Application No. PCT/EP2012/004716, filed on Nov. 13, 2012, which claims priority to German Patent Application No. 10 2011 086 320.6, filed on Nov. 14, 2011, both of which are hereby incorporated by reference herein in their entirety, including any figures, tables, or drawings.

BACKGROUND

The invention relates to a piece of furniture comprising an electronic switching element for an airliner and having a structural layer and a cover layer arranged above the structural layer.

Pieces of furniture in airliners, in particular pieces of furniture built into the particularly elaborately and specially fitted cabin interiors of so-called "VIP-aircraft", can be equipped with electronic switching elements. For example tables, chairs, side consoles or shelves can comprise electronic switching elements.

Pieces of furniture in VIP-aircraft usually comprise a structural layer made from a lightweight honeycomb construction and a precious wood veneer which is arranged over the top and sealed by a cover layer (varnish or resin).

The switching elements, for example switches for switching lighting means on and off, are provided on the surface of the pieces of furniture so as to be operated as easily as possible by the airline passenger.

A switch of this kind according to the prior art is illustrated by way of example in FIG. 1, which is described below.

In switches of this kind, which are usually inserted into or onto the surface of furniture in milled depressions, dirt can accumulate around the edges and in gaps and is very difficult to clean.

The dirt and the surface, which is not completely flat because of the insertion of the switching element, interfere with the overall aesthetic appearance and the electrical elements of the switches are also in principle vulnerable to the infiltration of fluids.

Particularly during a flight it is not possible to prevent liquid being spilled and getting into existing gaps and/or the switching element. Therefore, the electrical switching elements have to be provided with special safety mechanisms which increase the complexity of the whole system and can also be expensive.

Thus the object of the invention is to provide a piece of furniture comprising a switching element for an airliner in which the described problems do not arise or are at least not as considerable.

This object is achieved by the invention by means of the features of claim 1. Further preferred embodiments of the invention are described in the dependent claims, the figures and the associated description.

BRIEF SUMMARY OF THE INVENTION

To address the problem, a piece of furniture is thus proposed according to the invention comprising an electronic switching element for controlling a cabin function for an airliner, the piece of furniture comprising a structural layer and a cover layer arranged on top of the structural layer, and the electronic switching element being designed in the form of a capacitive switching element and being arranged underneath the cover layer inside and/or underneath the structural layer.

By designing the electronic switching element as a capacitive switching element, which is arranged underneath the cover layer, it is possible for the cover layer to be continuous and planar.

The cover layer protects the electronic and/or electrical components of the switching element continuously from any liquids spilled on the surface. There are no gaps or edges for dirt to collect in.

Preferably, the piece of furniture comprises a lighting means which is arranged above the capacitive switching element and underneath the cover layer. With a lighting means arranged above the capacitive switching element, the position of the capacitive switching element can be established accurately and intuitively by the user, i.e. for example the air passenger. The lighting means is preferably configured so that the lighting is sufficiently strong to identify the illuminated region when looking at the piece of furniture. It can thus be used as background lighting for the desired region.

The visibility of the lighting means can be improved by providing recesses in the structural layer above the lighting means. The light emitted by the lighting means does not then need to shine through solid components of the structural layer or parts of the structural layer. In this way, in preferred embodiments of the invention the structural layer comprises one or more recesses above the lighting means.

In a piece of furniture for a particularly elaborate (VIP) cabin interior the aesthetic appearance of the piece of furniture can be improved by an intermediate layer, which is preferably arranged between the structural layer and cover layer, and which is preferably in the form of a wooden veneer. The intermediate layer can thus be adapted to the desired aesthetic requirements.

The intermediate layer preferably comprises a window element, which is at least partly transparent for visible light and is arranged above the recesses of the structural layer. Similar to the described recesses, the window element ensures that the light emitted by the lighting means is clearly visible.

The window element is arranged in a corresponding milled groove of the intermediate layer. Said milled groove or the window element arranged therein and/or the previously described recesses of the structural layer preferably have a geometric shape that can be assigned to the cabin function to be controlled.

For example, a geometric shape can be selected which is similar to a reading lamp or a table lamp, and thus indicates to the air passenger that the electronic switching element is provided for controlling the lighting of the table or for controlling the reading lamp.

In this way the air passenger can recognise easily at once which cabin function can be controlled by the electronic switching element. Together with the lighting means the position and the corresponding cabin function of the electronic switching element are easy to recognise and thus also to operate.

The cover layer preferably consists of hardened resin and/or varnish. By means of such a cover layer the surface of the piece of furniture can be sealed. In another preferred configuration the cover layer can also be formed by a plastics film which is applied onto parts of the piece of furniture and protects said piece of furniture. The resins, varnishes or plastics films are preferably permeable to visible light or appear transparent, so that both the light of the lighting means and also the possibly high-quality wooden veneer surface remain visible.

Preferably, the window element is in the form of hardened resin and/or varnish. This has the advantage that it can be produced in one process with the application of the cover layer. Thus for example the described milled grooves are made in an intermediate layer in the form of a wooden varnish and afterwards the wooden veneer is provided with the cover layer.

In this case a varnish or resin is applied onto the veneer which then hardens. The varnish or resin can run into the grooves and then harden therein to form the window element. Alternatively, the window element can also be in the form of a plastics insert and can be inserted into the milled grooves prior to the application of the varnish or resin.

Preferably, by actuating the capacitive switching element the lighting means can be switched on or off. By configuring the components in this way the user gets an immediate response when the capacitive switching element is actuated. Other options for a corresponding response can be for example an acoustic signal and/or a mechanical vibration in the region of the electric switching element.

Preferably, the piece of furniture comprises a display and/or can be connected to a display and also the capacitive switching element can preferably be used for controlling a cabin function shown on the display.

Therefore by means of the capacitive switching element it is possible to operate the applications or cabin functions shown on the display. For example, the seat position can be adjusted if necessary, films or other electronic entertainment media can be selected and started and the volume of said media can be controlled. Applications are defined in this context to mean generally more complex cabin functions.

A control of this kind differs significantly from existing controls, as these are generally controlled by a touch screen. Although using touch screens in a control of this kind may be advantageous in some applications, separating the control can be advantageous, particularly for applications in which a touch screen input is difficult or undesirable for ergonomic reasons.

The integration of the control into a piece of furniture, for example into a seat, enables the air passenger to control the various cabin functions without effort and without having to press on a display directly.

In the case of a seat adjustment by means of various servomotors this is advantageous for the user, as he can change his seat position in this way without having to change or leave said seat to operate a display. Preferably, the electronic system and/or the cabling or cable guide is/are integrated into the piece of furniture or into the structural parts of the piece of furniture. In the case of a table the cable guide can be arranged for example in the table panel and not underneath the table panel.

The display can be arranged in the same first piece of furniture as the capacitive switching element, but it can also be arranged in another, second piece of furniture which is visible from the first piece of furniture.

Preferably, the capacitive switching element is configured so that a translatory actuation movement can be used for controlling a slide control. The capacitive switching element is thus preferably not limited to a binary data input or processing ("on-off" or "1-0"), but a translatory actuation movement can also be recognised as such and used for controlling a slide control. In this way it is possible to avoid an otherwise usually erratic incremental control.

For example, the volume control of the entertainment media can be controlled by a sweeping or a pivoting movement without having to press an individual switch multiple times.

A preferred option for allowing the input of sweeping or pivoting movements and also the input of simple control commands is to design the capacitive switching element so that it comprises a plurality of capacitive switches and/or sensor regions.

In another embodiment the capacitive switching element is configured so that, in addition to a translatory actuation movement, an actuation movement perpendicular thereto or a combination of both directions can be used for the control.

For example three sensor regions are provided, two of which are used for starting and ending cabin functions and/or applications. By means of an additional sensor region, in which a selection can be made between different cabin functions and/or applications by means of a translatory input movement, it is possible for example to adjust the volume of specific applications and/or cabin functions.

The sensor regions can be separated from one another locally and configured respectively for detecting specific kinds of input. For example, a sensor region can be configured to detect a translatory actuation movement or in addition detect a simple pressing or touching movement.

Said different sensor regions are preferably in the form of a plurality of capacitive switching elements, which are arranged next to one another underneath the component surface.

The cable guide is preferably integrated into the piece of furniture so that the piece of furniture and the electrical components form a structural unit.

BRIEF DESCRIPTION OF THE DRAWINGS

The invention is explained in the following by way of preferred embodiments with reference to the accompanying figures, in which.

DETAILED DESCRIPTION OF THE INVENTION

Figure 1:
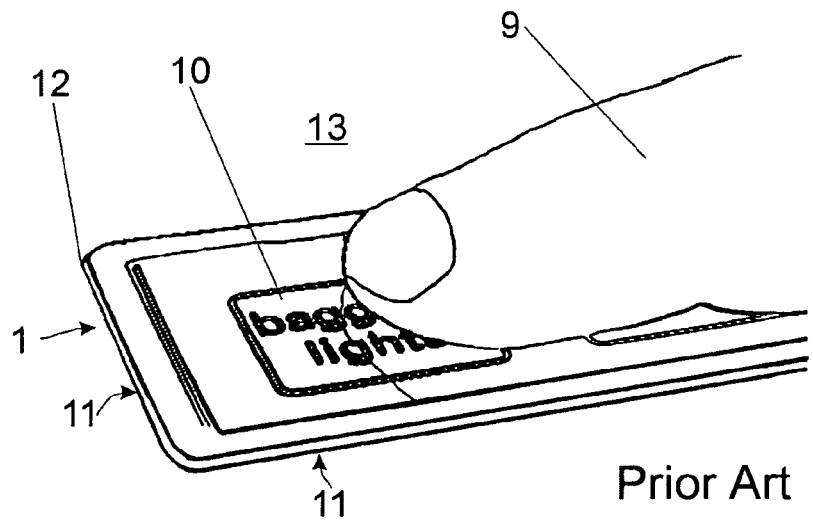
FIG. 1 shows an electronic switching element in a surface of a piece of furniture according to the prior art.

FIG. 1 shows an electronic switching element 1 which is installed in a surface 13 of a piece of furniture. The side edges 11 of the electronic switching element 1 project from the surface 13 of the piece of furniture. Said embodiment relates to a piece of furniture in a high quality cabin installation of a so-called VIP aircraft.

The electronic switching element 1 can be switched and operated by an actuation means 9, for example the finger of an air passenger. The electronic switching element 1 is used in this embodiment for controlling a cabin light.

Between the side edges 11 of the electronic switching element 1 and the piece of furniture there are one or more gaps 12. Even if the gap or gaps 12 are very narrow, due to the precise manufacturing of the components, spilt fluids could still penetrate through the gaps 12 and may damage the piece of furniture and/or the electronic switching element 1.

Furthermore, dirt can collect around the side edges 11 which is relatively difficult to clean.

Figure 2:
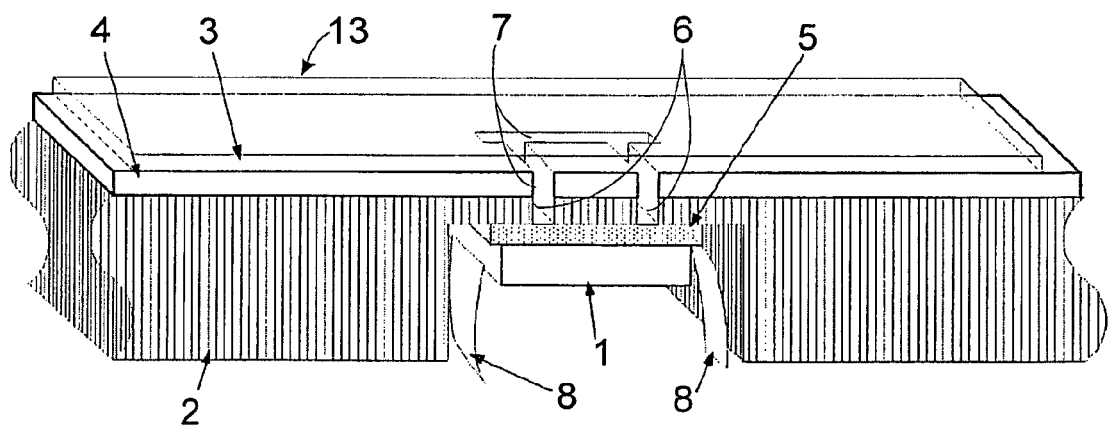
FIG. 2 shows an advantageous arrangement of a capacitive switching element underneath the cover layer.

FIG. 2 shows a preferred advantageous embodiment of a piece of furniture comprising an electronic switching element 1, FIG. 2 showing an isometric cross-sectional view of the portion in which the electronic switching element 1 is arranged. The electronic switching element 1 is also used here for controlling a cabin function.

The electronic switching element 1 is arranged inside the structural layer 2, which in this embodiment is configured as a light honeycomb structure. A light honeycomb structure of this kind typically has a top and a bottom layer, which are not shown in FIG. 2. The electronic switching element 1 is thus surrounded by the structural layer 2, a lighting means 5 being arranged above the electronic switching element 1 and possibly being configured for example as a circuit board with an LED light.

Electrical connections 8 connect the electronic switching element 1 and the lighting means 5 to the cabin function to be controlled or to a computer unit (not shown) controlling the cabin function. The necessary cabling or cable guide runs in the region of the piece of furniture, preferably in the structural layer 2 or another structural part of the piece of furniture. The same applies advantageously for other possibly provided electronic components.

The lighting means 5 is secured with its upper side to the structural layer 2. In the contact region the structural layer 2 comprises recesses 6, in which the light emitted by the lighting means 5 is not shielded by the structural layer 2.

An intermediate layer 4 is arranged above the structural layer 2. The intermediate layer is preferably a precious wood veneer and comprises a window element 7 in the region above the recesses 6 or the lighting means 5. The intermediate layer 4 is interrupted in the region of the window element 7. Preferably, a groove is milled in the region of the intermediate layer 4 into which the window element 7 is subsequently fitted or inserted.

The window element 7 preferably has a similar form to that of the underlying recesses 6.

A cover layer 3 is arranged above the intermediate layer 4. The cover layer 3 consists in this embodiment of a seal with transparent, hardened plastic resin or transparent plastics material.

The window element 7 in this embodiment also consists of transparent, hardened resin and is produced in one process together with the cover layer 3. Resin is applied onto the intermediate layer 4, which also forms the window element 7 on hardening. This step is usually performed before the intermediate layer 4 is fixed onto the structural layer 2.

By way of this method the window element 7 is adjusted exactly to the geometric shape which was previously milled into the intermediate layer 4. In another embodiment the window element 7 is formed by an insert, preferably a plastics insert, which is inserted into the corresponding milled groove and is adjusted to this shape. Furthermore, it may be possible in specific embodiments, for the cover layer 3 not to be in the form of a hardened resin or varnish, but to be in the form of a plastics film which is adhered onto the piece of furniture for example.

The geometric shape of the window element 7 is preferably selected so that it is possible to identify the cabin function to be controlled, or so that the user, for example the air passenger, associates the shape with the cabin function to be controlled when he sees the shape of the window element. For example the shape can be a distinctive symbol or can also comprise letters that name or describe the cabin function.

If the user wishes to switch the cabin light on or off he can trigger the capacitive switching element by moving his finger close to the symbol on the piece of furniture, which then sends a corresponding signal to the cabin light or the computer unit controlling the cabin light.

By advantageously arranging the capacitive switching element in the structural layer 2 and underneath the cover layer 3, the cover layer 3 is not interrupted in the region of the capacitive switching element. The cover layer 3 covers the entire region of the surface 13 of the piece of furniture in a planar manner; in the region of the electronic switching element 1 there are no gaps through which fluids could possibly penetrate into the piece of furniture.

Figure 3:
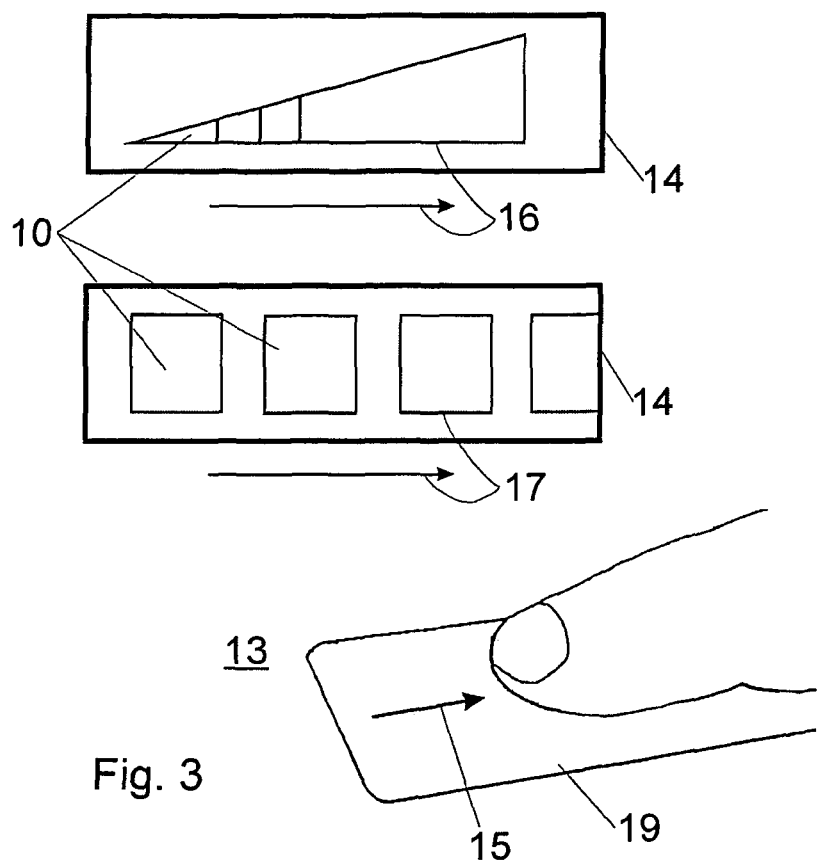
FIG. 3 is a view of a control of a cabin function by the capacitive switching element.

FIG. 3 shows the surface 13 of a piece of furniture, the sensor region 19 of the underlying capacitive switching element being highlighted.

In the upper part of FIG. 3 two displays 14 are shown. Cabin functions 10 are shown on the displays 14, which can consist of applications or controls for example.

The bottom display 14 shows a plurality of applications next to one another (the applications or the start button of the applications are illustrated in simplified form by squares). The top display 14 shows a slide control. The cabin functions shown on the displays 14 can be controlled by a translatory actuation movement 15 in the sensor region 19.

In the example of the top display the music volume can be adjusted by a slide control 16 for example. The longer the translatory actuation movement 15, the louder or softer the volume controlled by the slide control 16.

Furthermore, the translatory actuation movement 15 can also be used for menu navigation and thus for example an application 17 can be selected by means of which the desired application can be selected from available applications.

The displays 14 can be provided in the immediate vicinity of the electronic switching element, preferably in the same piece of furniture. For example, the display 14 can be arranged perpendicular to the component surface 13 in the region of the capacitive switching element so that it can be seen easily by the viewer.

In a further preferred embodiment two displays 14 are provided, one display 14 being arranged underneath the cover layer 3 and a further display 14 preferably being provided perpendicular thereto in a second position. Both displays 14 can show the same menu or different menus, so that the viewer can look at the display 14 that is most easily visible from his position. In addition or alternatively, the display 14 underneath the cover layer 3 can show or give the user an immediate response to any inputs.

Figure 4:
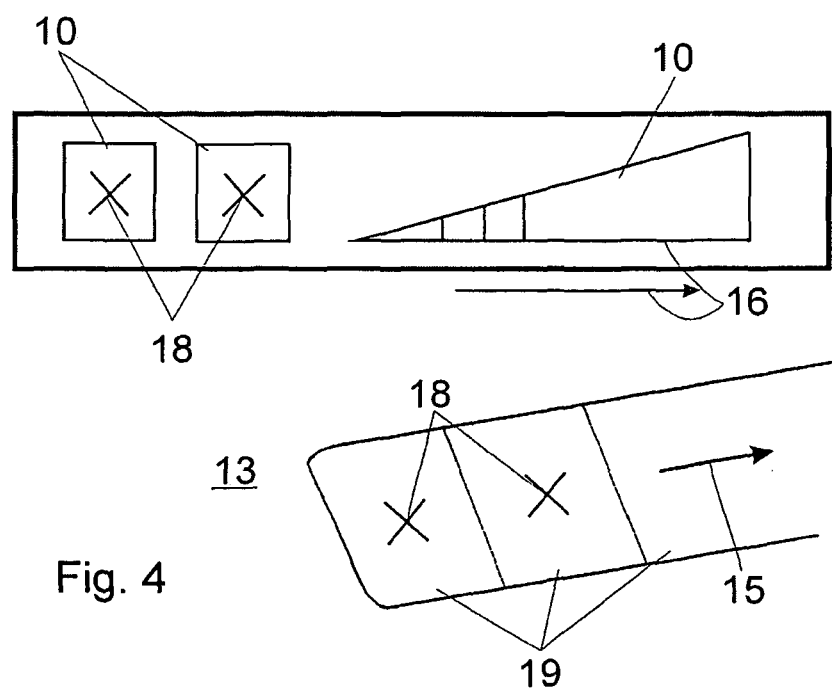
FIG. 4 is a view of a further control option for cabin functions using the capacitive switching element.

FIG. 4 shows a further preferred embodiment of the electronic switching element 1 which is arranged underneath the surface 13 of the piece of furniture. Here it comprises three sensor regions 19, one sensor region 19 being configured, as in FIG. 4, for detecting a translatory actuation movement 15, for example a sweeping or pivoting movement. The two additional sensor regions 19 are configured so that they only operate in binary. They are thus configured so that they send only a single on- or off-signal when actuated.

The electronic switching element 1 detects the actuation by a user in the different sensor regions 19 and shows the result on an associated display 14. For example, the seat can be adjusted by using the different adjustment options of various seat components which can be performed in different menus, or the volume control can be adjusted for example. In both cases a slide control 16 is suitable and advantageous.

Furthermore, applications can be launched or terminated by the application operation 18. For example, it is sufficient to simply touch the corresponding sensor region 19. The application operation 18 can also be used for menu navigation, for example for moving between different main menus and/or submenus.

In order to detect a translatory actuation movement 15 the capacitive switching element preferably comprises a plurality of capacitive switches which are arranged next to one another. By means of suitable programming the signals, which are time-staggered by said plurality of switches, can be evaluated and identified and utilised as a corresponding actuation signal.

In a preferred embodiment the size of the sensor region or regions 19 corresponds approximately to the size of the display or displays 14. In this way the user can easily associate the two with one another and the relatively small displays 14 can be provided more easily on arm rests or similar small surfaces. In another embodiment the sensor regions 19 are also preferably not only in one plane but are for example provided on the top of an arm rest and also on the front edge of the same arm rest.

Figure 5:
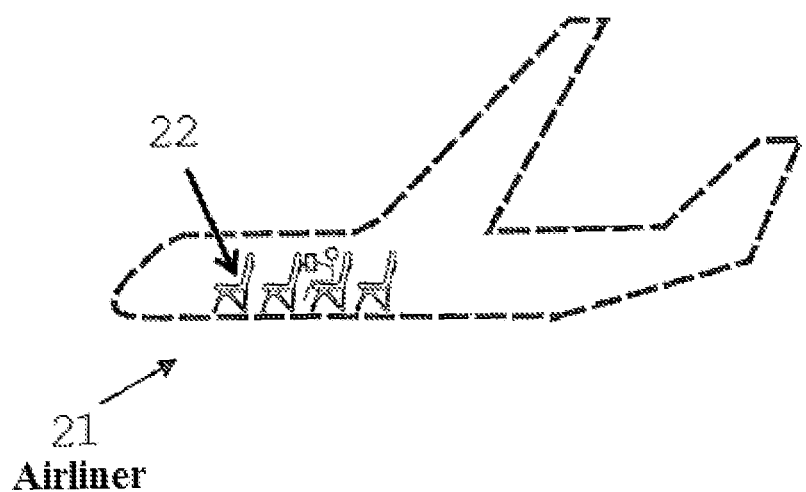
FIG. 5 is a view of an airliner incorporating a piece of furniture having an electronic switching element in accordance with an embodiment of the subject invention.

FIG. 5 is a view of an airliner 21 incorporating a piece of furniture 22 having an electronic switching element in accordance with an embodiment of the subject invention.

LIST OF REFERENCE NUMBERS

1 electronic switching element
2 structural layer
3 cover layer
4 intermediate layer
5 lighting means
6 recesses
7 window element
8 electrical connections
9 actuation means
10 cabin function
11 side edges
12 gap
13 surface of piece of furniture
14 display
15 translatory actuation movement
16 slide control
17 application selection
18 application operation
19 sensor region

The invention claimed is:

1. A piece of furniture, comprising:
a cover layer;
an intermediate layer;
a structural layer,
wherein the cover layer is above the structural layer, and
wherein the intermediate layer is positioned between the structural layer and the cover layer;
an electronic switching element,
wherein the electronic switching element is a capacitive switching element,
wherein the capacitive switching element is underneath the cover layer, and
wherein the capacitive switching element is either:
(i) underneath the structural layer;
(ii) inside the structural layer; or
(iii) underneath the structural layer and inside the structural layer; and
a light,
wherein the light is above the capacitive switching element and underneath the cover layer,
wherein the light is below at least a portion of the structural layer,
wherein the at least a portion of the structural layer above the light comprises one or more recesses such that at least a portion of emitted light emitted from the light passes through the one or more recesses to above the at least a portion of the structural layer without passing through material of the at least a portion of the structural layer,
wherein a groove having a first geometrical shape is milled through the intermediate layer,
wherein the intermediate layer comprises a window element having a second geometrical shape that is the same as the first geometrical shape,
wherein the window element is formed within the groove, fitted into the groove, or inserted into the groove,
wherein the window element is at least partly transparent to visible light, and
wherein the window element is arranged above the one or more recesses of the structural layer.

2. The piece of furniture according to claim 1,
wherein the capacitive switching element controls a function, and
wherein the function is a function of the piece of furniture or a function of a device proximate the piece of furniture.

3. The piece of furniture according to claim 1,
wherein the capacitive switching element is inside the structural layer.

4. The piece of furniture according to claim 1,
wherein the capacitive switching element is underneath the structural layer.

5. The piece of furniture according to claim 1,
wherein the intermediate layer is a wooden veneer.

6. The piece of furniture according to claim 1,
wherein the capacitive switching element controls a function,
wherein the function is a function of the piece of furniture or a function of a device proximate the piece of furniture, and
wherein the one or more recesses have a geometric shape that provides an indication of the function controlled by the electronic switching element.

7. The piece of furniture according to claim 1,
wherein the capacitive switching element controls a function,
wherein the function is a function of the piece of furniture or a function of a device proximate the piece of furniture, and
wherein the window element has a geometric shape that provides an indication of the function controlled by the electronic switching element.

8. The piece of furniture according to claim 1,
wherein the cover layer is a hardened resin and/or varnish.

9. The piece of furniture according to claim 1,
wherein the window element is a hardened resin and/or varnish.

10. The piece of furniture according to claim 1,
wherein the light is switched on or off by actuating the capacitive switching element.

11. The piece of furniture according to claim 2, further comprising:
a display,
wherein the function the capacitive switching element controls is represented on the display.

12. The piece of furniture according to claim 11,
wherein the capacitive switching element is configured such that a translatory actuation movement controls a slide control.

13. The piece of furniture according to claim 1,
wherein the capacitive switching element comprises a plurality of capacitive switches and/or sensor regions.

14. The piece of furniture according to claim 1, further comprising:
one or more electronic components, cabling, and/or a cable guide,
wherein the one or more electronic components, cabling, and/or the cable guide is integrated into the piece of furniture or integrated into a structural part of the piece of furniture.

15. The piece of furniture according to claim 1,
wherein the intermediate layer is below the cover layer and above the structural layer.

16. The piece of furniture according to claim 1,
wherein the at least a portion of emitted light emitted from the light that passes through the one or more recesses to above the at least a portion of the structural layer passes through the window element and through the cover layer to above the cover layer.

17. The piece of furniture according to claim 1,
wherein the light is underneath the at least a portion of the structural layer,
wherein the at least a portion of the structural layer is directly above the light, and
wherein at least a second portion of emitted light emitted from the light is shielded by the at least a portion of the structural layer directly above the light such that the at least a second portion of emitted light emitted from the light does not pass through the one or more recesses to above the at least a portion of the structural layer.

18. A method of controlling a cabin function in an airliner, comprising:
providing a piece of furniture in an airliner, wherein the piece of furniture comprises:
a cover layer;
an intermediate layer;
a structural layer,
wherein the cover layer is above the structural layer, and
wherein the intermediate layer is positioned between the structural layer and the cover layer;
an electronic switching element,
wherein the electronic switching element is a capacitive switching element,
wherein the capacitive switching element is underneath the cover layer, and
wherein the capacitive switching element is either:
(i) underneath the structural layer;
(ii) inside the structural layer; or
(iii) underneath the structural layer and inside the structural layer; and
a light,
wherein the light is above the capacitive switching element and underneath the cover layer,
wherein the light is below at least a portion of the structural layer,
wherein the at least a portion of the structural layer above the light comprises one or more recesses such that at least a portion of emitted light emitted from the light passes through the one or more recesses to above the at least a portion of the structural layer without passing through material of the at least a portion of the structural layer,
wherein a groove having a first geometrical shape is milled through the intermediate layer,
wherein the intermediate layer comprises a window element having a second geometrical shape that is the same as the first geometrical shape,
wherein the window element is formed within the groove, fitted into the groove, or inserted into the groove,
wherein the window element is at least partly transparent to visible light, and
wherein the window element is arranged above the one or more recesses of the structural layer; and
triggering the electronic switching element.

19. An airliner, comprising:
a piece of furniture positioned in the airliner, wherein the piece of furniture comprises:
a cover layer;
an intermediate layer;
a structural layer,
wherein the cover layer is above the structural layer, and
wherein the intermediate layer is positioned between the structural layer and the cover layer;
an electronic switching element,
wherein the electronic switching element is a capacitive switching element,
wherein the capacitive switching element is underneath the cover layer, and
wherein the capacitive switching element is either:
(i) underneath the structural layer;
(ii) inside the structural layer; or
(iii) underneath the structural layer and inside the structural layer; and
a light,
wherein the light is above the capacitive switching element and underneath the cover layer,
wherein the light is below at least a portion of the structural layer,
wherein the at least a portion of the structural layer above the light comprises one or more recesses such that at least a portion of emitted light emitted from the light passes through the one or more recesses to above the at least a portion of the structural layer without passing through material of the at least a portion of the structural layer,
wherein a groove having a first geometrical shape is milled through the intermediate layer,
wherein the intermediate layer comprises a window element having a second geometrical shape that is the same as the first geometrical shape,
wherein the window element is formed within the groove, fitted into the groove, or inserted into the groove,
wherein the window element is at least partly transparent to visible light, and
wherein the window element is arranged above the one or more recesses of the structural layer.

20. The airliner according to claim 19,
wherein the at least a portion of emitted light emitted from the light that passes through the one or more recesses to above the at least a portion of the structural layer passes through the window element and through the cover layer to above the cover layer.

21. The airliner according to claim 19,
wherein the capacitive switching element controls a function, and
wherein the function is a function of the piece of furniture or a function of a device proximate the piece of furniture, wherein the airliner further comprises:
   a display,
      wherein the function the capacitive switching element controls is represented on the display.
22. The airliner according to claim 21, wherein the capacitive switching element is configured such that a translatory actuation movement controls a slide control.

* * * * *